April 18, 1961 F. G. MASON 2,980,796

RADIO-FREQUENCY TUNER

Filed Dec. 18, 1957 2 Sheets-Sheet 1

INVENTOR.
Francis G. Mason
BY
Ooms, McDougall, Williams & Hersh
Attorneys

April 18, 1961 F. G. MASON 2,980,796

RADIO-FREQUENCY TUNER

Filed Dec. 18, 1957

2 Sheets-Sheet 2

INVENTOR.
Francis G. Mason
BY
Oons, McDougall, Williams & Hersh
Attorneys

United States Patent Office 2,980,796

Patented Apr. 18, 1961

2,980,796

RADIO-FREQUENCY TUNER

Francis G. Mason, Westport, Conn., assignor to Aladdin Industries, Incorporated, Nashville, Tenn., a corporation of Illinois Filed Dec. 18, 1957, Ser. No. 703,604

4 Claims. (Cl. 250—40)

This invention relates to the field of radio-frequency tuners. In particular, it is directed to a tuner, such as is employed in television receivers, wherein a plurality of pre-selected and pre-adjusted tuning positions are manually selectable.

One of the features commonly found in tuners of this type is a detent means for defining each of the various predetermined tuning positions which correspond to the signal channels to be received. A feature and object of the present invention is to provide a tuner wherein the cam drive which operates the tuned circuits provides its own detenting action, thus eliminating the need for conventional detent mechanisms such as spring-loaded balls, etc.

Another object of the present invention is to provide a tuner having a cam drive which may be individually adjusted for each of the channel settings and which at the same time is characterized by structural simplicity and low cost.

A still further object of the invention is to provide, in a tuner having a plurality of tuned circuits, means whereby one or more of such circuits having critical tuning characteristics can be individually adjusted for each channel setting without disturbing the tuning adjustments of the other tuned circuits.

Still another object of the invention is to provide a multi-circuit tuner in which all the circuits are tuned by sliding conductive slide members along tuning coils, means being provided for individual adjustment of the circuits in each channel position of the tuner and special adjusting means being provided for any particularly critical tuned circuit.

Yet another object of my invention is to provide a multi-circuit tuner in which coarse adjustment of all the tuned circuits for the various channels is achieved by means of a single cam, while providing auxiliary adjusting means for any critical circuits that can be individually tuned for each channel during initial factory adjustment and which is ganged with the cam for manual operation by a single knob.

Other objects and advantages of the invention will appear from the following detailed description of a typical embodiment of the invention.

Figure 1:
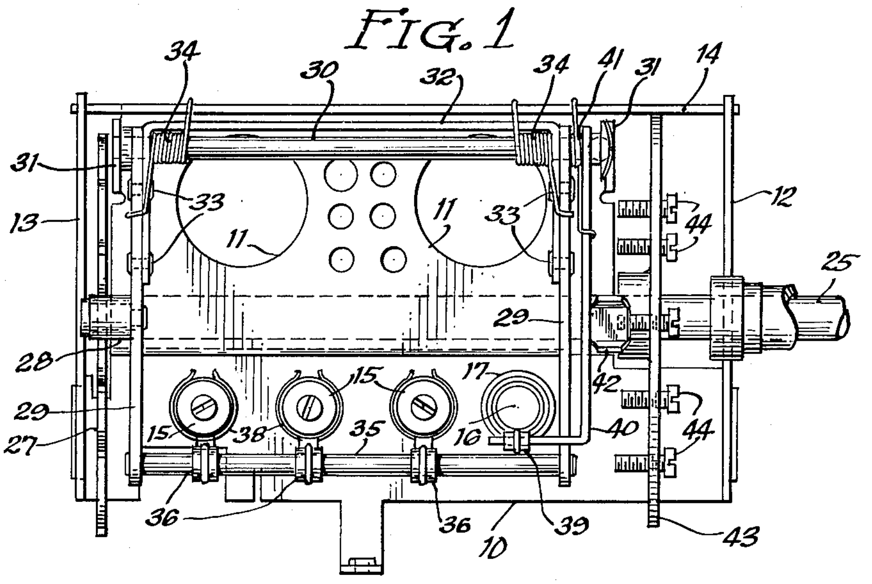
Figure 2:
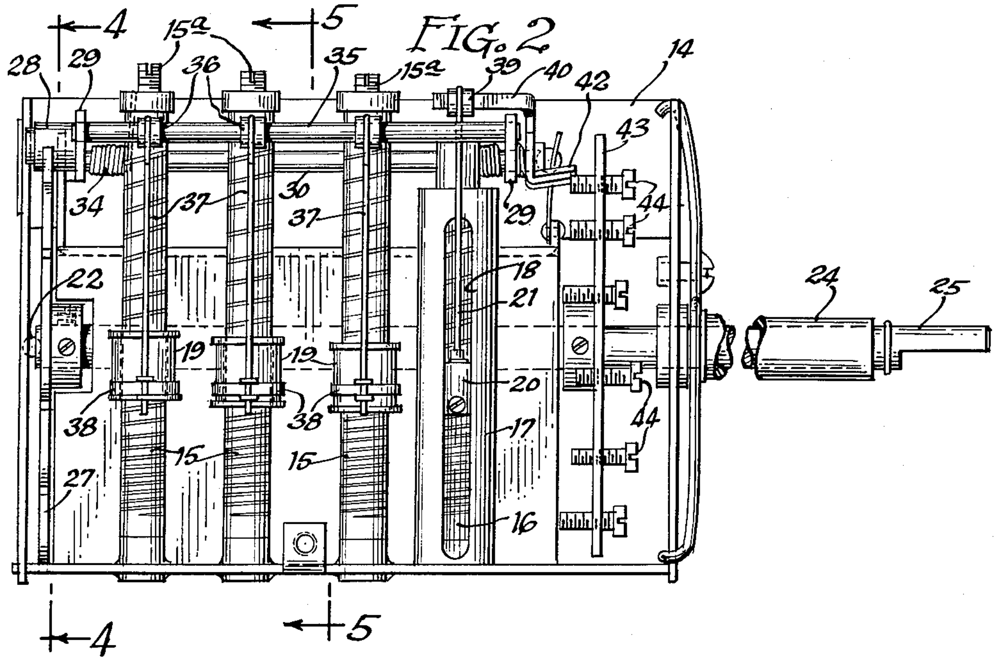
Figure 3:
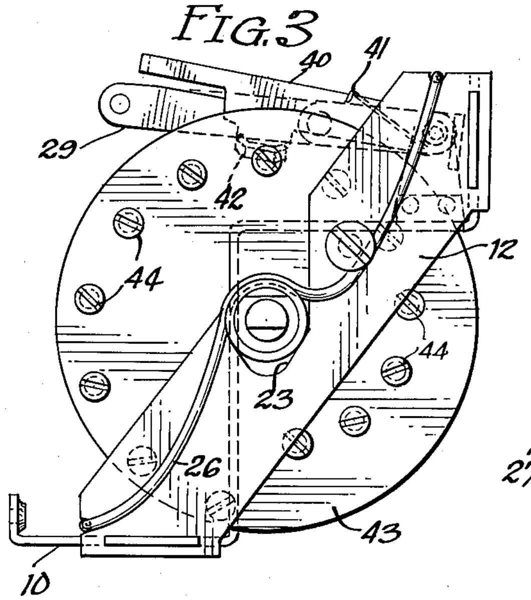
Figure 4:
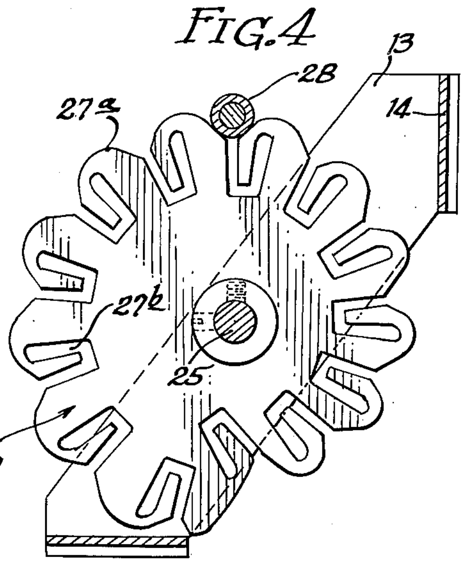
Figure 5:
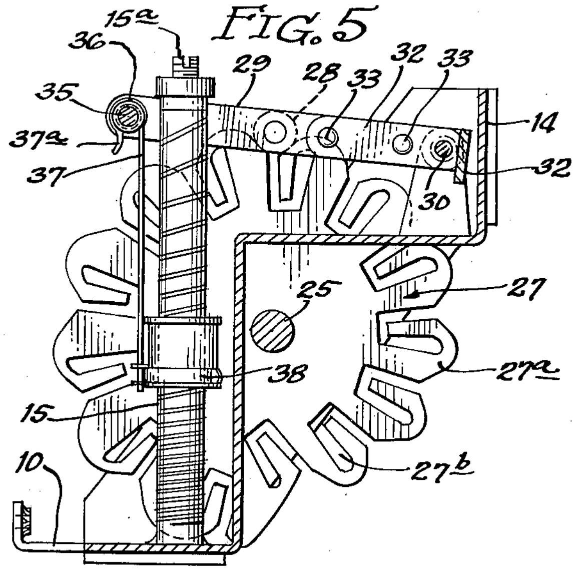
Figure 6:
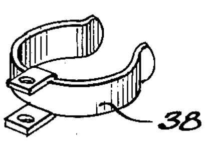

In the appended drawing, Figure 1 shows a typical tuner embodying the present invention as it appears in plan view. Fig. 2 is a side elevation view of the Fig. 1 tuner. Fig. 3 is an end view of the Fig. 1 tuner, as viewed from the right-hand side of Fig. 1. Fig. 4 is a fragmentary view partially in section, along the line 4—4 of Fig. 2, looking toward the rear of the tuner. Fig. 5 is a sectional view of the tuner, looking toward the rear, along the line 5—5 of Fig. 2. Fig. 6 is a perspective view of one of the contactor clips employed in the tuning assembly.

For illustrative purposes in the present specification, I shall describe a typical tuner adapted for use in a modern television receiver. While the circuit details do not of themselves form a part of the present invention, it may be assumed that the circuit is of generally conventional character, consisting of a radio-frequency amplifier, a mixer stage, and a local oscillator. Such a tuner will normally comprise a plurality of tuned circuits employed in the radio-frequency and mixer stages, plus an additional tuned circuit for the oscillator stage. The oscillator stage in such a tuner must be adjusted to cover a somewhat different frequency range than the other circuits, to provide for each channel the appropriate beat frequency necessary for signal conversion to the intermediate frequency used in the receiver. Moreover, the tuning of the oscillator is, in such a tuner, more critical than the tuning of the other circuits. Accordingly, as I shall presently explain, my tuner embodies special means permitting individual adjustment of the oscillator circuit in each channel position.

Inasmuch as my invention does not directly involve the circuit details, I have in the drawing omitted a number of conventional circuit elements, such as vacuum tubes, fixed capacitors, resistors, choke coils, and other parts which enter into a conventional tuner of the type described. This has been done both in the interest of simplifying the present description and for the purpose of bringing out more clearly mechanical features which might otherwise be obstructed by such electrical circuit elements.

As shown in Fig. 1, my tuner is mounted on a rigid metal chassis or frame 10, having a flat bed portion suitably punched, as at 11, with apertures to receive tube sockets and other circuit elements. At both the front and rear ends of the bed portion of the chassis I provide end plates 12 and 13, rising at right angles from the bed plate and providing support means for the tuning shaft presently to be described. A vertically positioned strip 14 joins the front and rear plates 12 and 13 to give rigidity to the structure.

The tuned circuits employed in my tuner consist, in the embodiment shown, of four tuning coils which are mounted in a vertical position on the bed plate of frame 10. Of these tuned circuits, three are used for tuning the radio-frequency amplifier and mixer circuits and may be essentially identical. These are all marked with the reference numeral 15. The fourth tuned circuit, used for tuning the oscillator, will have somewhat different electrical characteristics from those of coils 15, and it is designated with the reference numeral 16.

The tuning coils 15 are of the same general type as those disclosed in my copending application No. 679,172, filed August 20, 1957. They consist of a flat, generally helical ribbon of copper or other conducting material, supported on a cylindrical form made of glass or other low-loss insulating material. Preferably the coils 15 are made by circuit-printing methods which are known to those skilled in the art and need not be described. The coils 15 are coated with a thin layer of insulating material such as epoxy resin, which afford electrical insulation and mechanical protection for the coil. Both the coil ribbon and the insulating coating are very thin.

The coil 16, used for oscillator tuning, is structurally similar to coils 15. Because of the different requirements of the oscillator circuit, however, the oscillator coil 16 is surrounded by a tubular shield 17 having an axial slot along the greater part of its length, as indicated at 18.

The coils 15 and 16 are tuned by means of conducting rings or slide members, marked 19 in the case of coil 15 and marked 20 in the case of coil 16, which overlie the respective coils and slide therealong responsively to operation of the mechanism presently to be described. Each of the coils forms a two-terminal circuit, one of the terminals being fixedly situated at the upper end of the coil, and the other terminal being the sliding sleeve 19 or 20. The effective tuned circuit in each case consists of the portion of the coil between the sliding sleeve and the top terminal, the resonating capacitance consisting of the distributed capacitance of the active portion of the coil, together with the capacitance between the sleeve and the coil in series with any distributed or lumped capacitance provided by the external circuit connected to the coil terminals.

Connection between the respective tuning sleeves and the external circuit is provided differently in the case of the coils 15 and the oscillator coil 16. In the case of the coils 15, circuit connections to the respective sleeves 19 are provided by means of pigtail leads (not shown) soldered to the outer surfaces of the sleeves 19. These pigtail leads may be made of a suitable flexible wire such as Tensolite, and they have proved to be highly satisfactory in life tests, having undergone more than 100,000 complete tuning cycles without breaking. Since these pigtail connections have no bearing on the mechanical tuning mechanism which is the subject of the present invention, there will be no need to describe them further.

Because the use of a pigtail circuit connector to the tuning slide 20 of coil 16 would have an adverse effect on the reset characteristics of the oscillator circuit, I have provided for the oscillator coil 16 a fixed circuit connection in the form of the slotted shield 17. Tuning slide 20 is provided on its outer surface with a thin layer of epoxy insulation similar to that which covers the coil 16, and the electrical connection to the tuning slide 20 is thus made capacitively by means of the capacitance defined by the inner surface of the shield 17 and the outer surface of the slide 20. The slot 18 provides for mechanical access to the slide 20 permitting it to be moved up and down by means of the rod 21, presently to be described. It will of course be understood that a fixed external circuit connection may be made to the shield 17 in any manner desired. If the oscillator circuit calls for one of the terminals of coil 16 to be grounded, this can be accomplished by soldering the lower end of the shield 17 to the chassis 10.

In tuners of the type illustrated, the particular coil design employed will depend on the frequency range to be covered and the relative distribution of the desired channels within that range. It should accordingly be understood that the coils shown in the drawing are intended to be diagrammatic, so far as the number of turns, pitch of turns, etc. are concerned.

A main tuning shaft 25 is mounted in suitable bearings provided in the end plates 12 and 13. The rear bearing for shaft 25 is preferably of the ball type, as indicated in Fig. 2 by the reference numeral 22. The front bearing is illustrated in Fig. 3 and includes a fine-tuning mechanism of the general type disclosed and claimed in the copending application of Louis E. Coutermash, Serial No. 499,269, filed April 5, 1955, now Patent No. 2,872,824. In this arrangement, the front end plate 12 is notched at 23 to receive an outer shaft 24 of larger diameter than main shaft 23, and a strong wire spring 26 is mounted with its ends secured to end plate 12 and positioned to press the shaft 24 into the notch 23. For mechanical stability, the outer surface of the shaft 24 may be provided with a shallow annular grove to receive the spring 26. Shaft 24 is drilled axially to provide a passage for the shaft 25 therethrough, the shafts, however, being slightly eccentric. With this arrangement, rotation of the shaft 24, as by means of a manual knob carried thereon, will produce a slight rocking of the shaft 25 and will thereby move very slightly the tuning mechanism presently to be described.

Since this fine-tuning mechanism is not part of the present invention, it need not be more fully treated in this description.

Keyed to the rear end of shaft 25, immediately in front of the rear bearing 22, I provide a tuning cam 27. Cam 27 is provided around its periphery with a number of lobes **27*a***, preferably spaced equi-angularly and designed with progressively greater radial dimensions. This construction is shown clearly in Figs. 4 and 5.

Each of the lobes **27*a* is formed with a reentrant slot 27*b* having a circumferential portion and a radial portion. By manual insertion of a screw driver into either the circumferential or radial parts of the slots 27*b*, the individual lobes 27*a*** can be bent so as to vary slightly the effective radial dimensions of the various lobes.

As may be seen from Figs. 4 and 5, the lobes of the cam 27 are positioned closely adjacent one another, and each lobe has a central portion of greater radial dimension than the parts of the lobe immediately adjacent thereto, so that the lobes define a group of recessed portions or "lows," respectively separated by curved raised zones or "highs."

For cooperation with the cam 27, I provide a cylindrical cam follower 28 which is mounted on the rearward one of a pair of rocker arms 29. Rocker arms 29 are journaled for rotation on a shaft 30 situated adjacent side frame member 14 and held in frame-carried bearings 31. Joining the two rocker arms 29 together and insuring their motion as a unit is a U-shaped link 32 which is secured to each of the arms 29 by means of rivets 33. The rocker arms 29 and the cam follower 28 are spring-biased against the cam 27 by means of a pair of torsion springs 34 carried on shafts 30 and having their respective ends seated against the rocker arms 29 and the frame member 14.

The outer ends of the rocker arms 29 are joined together by a rod 35. Rod 35 carries, spaced along its length, a group of insulating support members 36, preferably made of nylon or other similar material, over which the control rods 37 for slide members 19 are secured.

The rods 37 are required, during tuning movement, to undergo a small amount of flexure, and it is desirable that they have freedom to rotate slightly relative to the rod 35. For that reason, the rods 37 are preferably modified at their upper ends, as shown in Fig. 5, to form spring clamp terminals **37*a* which are snapped over the sleeves 36, the sleeves being free to rotate on the rod 35**.

At their respective lower ends, the control rods 37 are soldered or otherwise securely held to clamp members 38, which respectively are snapped over the tuning sliders 19. One of the clamp members 38 is shown in perspective in Fig. 6.

The arrangement just described affords freedom of adjustment with respect to the positions of the slide elements 19 and the control rods 37. This adjustability is a valuable feature of my invention. Normally the optimum positions of the slide members 19 on the respective coils 15 will be about the same for any given channel, since the three coils 15 are normally tuned to the same frequency for each channel. Small differences in the circuit capacitance associated with the various coils 15 may require, however, that the tuning sliders 19 be slightly staggered relative to one another. Such staggering is made possible by the control arrangement just described, comprising the clamps 38. As indicated in Fig. 2, the optimum positions of the respective slide members 19 can be determined experimentally during the factory adjustment of the tuner, and the clamps 38 positioned thereon accordingly. After the optimum relative positions of the clamp members 38 on the respective slide members 19 have been determined, the clamps can then be soldered, cemented, or otherwise secured permanently in position.

From the foregoing description, and from a study of Figs. 2 and 5, it will be seen that rotation of shaft 25 will successively bring the cam follower 28 into a series of stable positions whereat it is seated between adjacent lobes **27*a*. As the shaft 25 is rotated, the rocker arms 29 will move in position and cause the tuning sliders 19 to move along the coils 15. By its design, the cam 27 will give the tuner an inherent detent action, since the cam follower 28 will find a stable position in each of the "lows" between the respective lobes 27a. Adjustment of the tuning-slide positions for each channel setting may be made by insertion of a screw driver into either the radial or circumferential portions of the respective slots 27b. Additional individual circuit adjustments, to achieve optimum "tracking" of the various tuned circuits may be achieved by screw-driver adjustment of the movable cores 15a with which the coils 15** will normally be provided.

I shall now describe the manner in which I provide for individual channel-by-channel adjustment of the oscillator coil 16.

Control rod 21, which is secured at its lower end to the tuning slider 20, is mounted at its upper end, through an insulating sleeve 39, to an auxiliary rocker arm 40, the rear end of which is journaled on shaft 30 previously mentioned. A torsion spring 41, encircling the shaft 30, has its respective ends seated on the frame member 14 and the rocker arm 40, biasing the rocker arm 40 downward.

As may be seen from Fig. 1, rocker arm 40 has a right-angle bend in it near its front end, so that the arm crosses over one of the rocker arms 29 and terminates over oscillator coil 16.

Intermediate its ends and substantially directly over the shaft 25, rocker arm 40 has integrally formed therein a laterally extending boss 42, the lower surface of which is canted upward at a slight angle. Boss 42 is positioned for cooperation with a disc-shaped cam element 43, mounted on and keyed to shaft 25 immediately behind the front end plate 12. Spirally disposed around the center of cam disc 43, at angular positions corresponding to the various "lows" of cam 28, are a plurality of screws 44, positioned with their heads on the side of cam 43 adjacent end plate 12 and with their shanks extending into the space behind cam 43. The radial disposition of the various screws 44 is such that, in each channel position defined by a "low" on cam 28, one of the screws 44 is directly under the boss 42 carried by rocker arm 40. In each channel position of the tuner, therefore, it is possible to adjust the position of rocker arm 40, and hence of slide member 20, with great precision, merely by turning the particular screw 44 which is then in abutment with boss 42. Since the under surface of the boss 42 is slightly canted upward, the rocker arm 40 is raised when the screw 44 in abutment with boss 42 is screwed inward, and the arm 40 is correspondingly lowered, under the urging of spring 41, when the screw 44 in abutment with boss 42 is screwed outward.

When shaft 25 is rotated to select a new channel, the particular screw 44 formerly in abutment with boss 42 rotates out of engagement therewith, the rocker arm 29 engages arm 40, and sliders 19 and 20 thereupon move together to the position appropriate to the newly selected channel. When cam follower 28 stops in the "low" of cam 27 corresponding to the newly selected channel, a new screw 44 takes its place under the boss 42, and hence governs the position of the oscillator slide 20 for that channel.

It will of course be understood that the arm 40, the boss 42, and the screws 44 are so positioned that in each channel setting the particular screw 44 then in engagement with the boss 42 holds the arm 40 above and free of the rocker arm 29, thus leaving the oscillator slider 20 free for control by the position of screw 44.

From the foregoing description, it will be apparent that, in the initial adjustment of my tuner at the factory, the optimum oscillator frequency for each channel can be set with very great precision by adjustment of the respective screws 44, independently of the tuning of the various coils 15. Once the screws 44 have been correctly adjusted, they can then be held against undesired rotation by cementing or in any other suitable fashion, thus insuring that the adjustment will remain correct during the normal use of the tuner.

From the previous description of the fine-tuning mechanism, it will be realized that rotation of shaft 24, by rocking slightly the shaft 25, will produce a very slight upward and downward movement of the particular screw 44 which is then bearing against the boss 42, thus providing a vernier control of the oscillator frequency.

In the television-tuner application of my invention, the oscillator circuit is the only one whose tuning is sufficiently critical to require an individual channel-by-channel adjusting means such as is exemplified by the rocker arm 40, cam 43, and screws 44. In other applications, the use of such individual-channel adjusting means might be required for more than one tuned circuit, and my invention embraces the use of as many such means as the particular application may justify.

While the foregoing description of a typical embodiment of my invention has recited many of the structural features in considerable detail, it should be understood that it is intended to be illustrative only rather than limiting. Persons skilled in the art will be able to make many variations in the structure described without departing from the true spirit and scope of the invention as exemplified in the foregoing description and defined in the appended claims.

I claim:

1. In a radio-frequency tuner having a first tuned circuit tunable by movement of a first tuning element and a second tuned circuit tunable by movement of a second tuning element, the combination comprising a tuning cam mounted for movement in a predetermined locus and having a plurality of distinct positions representative of frequency channels to be tuned, means for moving said cam into any selected one of said positions, cam-follower means connected to said first tuning element and operative responsively to engagement with said cam to move said first tuning element and thereby to tune said first circuit to a frequency channel corresponding to said selected position, means for moving said second tuning element, said moving means being mounted in a lost-motion relation with said follower means operative to move said second tuning element responsively to rotation of said cam while leaving to said moving means in each cam position a limited range of movement independently of said follower means, a second cam operatively connected to said cam-moving means for movement thereby in step with said first cam, said second cam being provided with a plurality of individually adjustable elements spatially disposed thereon to correspond with said distinct positions of said first cam and means operatively associating said second cam and said means for moving said second tuning element for causing said second tuning element to move within said limited range responsively to engagement with a particular one of said adjustable elements when said first cam is moved into a selected one of said positions, whereby optimum tuning of said second circuit for each of said channels may be achieved by adjustment of said adjustable elements.

2. In a radio-frequency tuner having a first tuned circuit tunable by movement of a first tuning element and a second tuned circuit tunable by movement of a second tuning element, the combination which comprises a rotary tuning cam having a plurality of distinct positions representative of frequency channels to be tuned, cam-rotating means operable to move said cam into any selected one of said positions, cam-follower means connected to said first tuning element and operative responsively to engagement with said cam to move said first tuning element and thereby to tune said first circuit to a frequency channel corresponding to the position of said cam, means for moving said second tuning element, said moving means being mounted in a lost-motion relation with said follower means operative to move said second tuning element when said cam is rotated from one position to another while leaving to said moving means in each cam position a limited range of movement independently of said follower means, a second cam operatively connected to said cam-rotating means for rotation thereby in step with said first cam, said second cam having a plurality of individually adjustable elements, one for each of said distinct positions of said first cam and spaced on said second cam in a pattern corresponding with said positions of said first cam, and means operatively associating said second cam with said moving means for causing said second tuning element to move slightly within said limited range responsively to engagement between said moving means and a particular one of said adjustable elements when said first cam is rotated into any selected one of said positions, whereby the optimum tuning of said second circuit for each of said frequency channels may be achieved by adjustment of said adjustable elements.

3. The apparatus defined in claim 2 wherein said second cam comprises a flat plate mounted for rotation, and wherein said adjustable elements comprise screws spirally distributed on the face of said plate and threadedly carried thereby.

4. The apparatus defined in claim 3 wherein said means associating said second cam and said means for moving said second tuning element consists of an inclined projection connected to said moving means and positioned adjacent said second cam.

References Cited in the file of this patent

UNITED STATES PATENTS

| | | |
|---|---|---|
| 1,853,039 | Churchward | Apr. 12, 1932 |
| 2,555,053 | Myrick | May 29, 1951 |
| 2,580,895 | De Tar | Jan. 1, 1952 |
| 2,774,880 | Tulmer | Dec. 18, 1956 |
| 2,808,506 | Skwarek | Oct. 1, 1957 |
| 2,858,093 | Knoll | Oct. 28, 1958 |
| 2,872,824 | Coutermash | Feb. 10, 1959 |
| 2,913,681 | Lyman | Nov. 17, 1959 |